(12) United States Patent
Koyama

(10) Patent No.: US 6,348,689 B1
(45) Date of Patent: Feb. 19, 2002

(54) FOCUSED ION BEAM APPARATUS

(75) Inventor: Yoshihiro Koyama, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/310,767

(22) Filed: May 13, 1999

(30) Foreign Application Priority Data

May 15, 1998 (JP) .......................................... 10-133356

(51) Int. Cl.⁷ ......................... H01J 37/30; H01J 37/317
(52) U.S. Cl. .................. 250/309; 250/306; 250/396 R; 250/397; 250/492.2; 250/492.21
(58) Field of Search ................................ 250/309, 306, 250/396 R, 397, 492.2, 492.21

(56) References Cited

U.S. PATENT DOCUMENTS 5,083,033 A * 1/1992 Komano et al. .......... 250/492.2
5,854,488 A * 12/1998 Aita ............................ 250/309
5,976,328 A * 11/1999 Azuma et al. .......... 204/192.34

FOREIGN PATENT DOCUMENTS

| JP | 5198282 | 8/1993 |
| JP | 7333120 | 12/1995 |
| JP | 10-74737 | 3/1998 |

* cited by examiner

Primary Examiner—Bruce Anderson
Assistant Examiner—Nikita Wells
(74) Attorney, Agent, or Firm—Adams & Wilks

(57) ABSTRACT

A charged particle beam apparatus has a heater for heating an internal component to a sufficient temperature to prevent solidification of particles thereon and to thus improve the reliability of the apparatus. In a preferred embodiment, the apparatus is a focused ion beam apparatus having an ion source and a focusing optical system contained in a housing. A scanning electrode contained in the housing scans the focused ion beam across a desired region of a sample surface. The heater maintains the temperature of the focusing optical system at a sufficient temperature to prevent a gas contained in the housing from solidifying in the heated internal component. A secondary charged particle detector detects secondary charged particles generated in response to the ion beam irradiation and outputs a corresponding signal, and a display unit displays an image of the sample surface based on the output signal of the secondary charged particle detector. A gas injection gun blows a gas toward the sample surface. The gas may be an etch-assist gas which cooperates with the focused ion beam to etch the region of the sample surface irradiated by the focused ion beam, or a deposition-assist gas which cooperates with the focused ion beam to deposit a film on the region of the sample surface irradiated by the focused ion beam.

37 Claims, 1 Drawing Sheet

FOCUSED ION BEAM APPARATUS

BACKGROUND OF THE INVENTION

The present invention relates to a focused ion beam processing apparatus for performing fine-processing on a sample surface by scanning and irradiating a focused ion beam onto the sample surface while injecting blowing a gas thereon.

In order to carry out selective etching, enhanced etching or deposition processing using a focused ion beam apparatus, processing is conducted while locally injecting blowing a gas to a focussed ion beam irradiating site.

Gases used for performing this etching (etching gas) include principally a halide-based gas to provide reactivity with a sample material, while gases used for performing deposition (deposition gas) include a carbonyl-based compound. Hereinafter, both etching assist gas and deposition assist gas will be collectively referred to herein as material gas.

In the above-described charged particle beam apparatus, when blowing a gas onto a sample, a sample chamber is also filled by the gas. Where the gas is incident on and precipitated on an ion beam optical system surface and a high voltage is applied to the ion optical system, discharge is likely to occur.

If discharge occurs during a process, a beam will impinge on for the sample portions than a predetermined irradiation area. Desired processing or observation can not be done. Also, the occurrence of discharge causes a large amount of current to flow to the ion optical system control unit, resulting in the possibility of damaging the control unit or the like.

SUMMARY OF THE INVENTION

In order to solve the above problem, a roughening liable to induce high voltage discharge is prevented from being formed which makes it difficult for gas to be adsorbed on the ion optical system surface and prevents it from precipitating thereon.

The mean adsorption time t that the gas is adsorbed on the ion optical system surface can be expressed as follows, wherein an activation energy for escape is expressed by the variable Ed.

$$t = T_0 \text{ EXP}(Ed/RT)$$

where $t_0$ is a constant, R is a gas constant and T is absolute temperature.

In the above equation, when t approaches 0 endlessly, there becomes almost no gas adsorption on the ion optical system surface. Due to this, gas adsorption can be prevented from occurring by heating the ion optical system surface such that the mean adsorbtion time t decreases.

Also, the material gas to be used for ion beam processing is generally one that is high in vapor pressure. The substance not in vaporization at normal temperature is solid or liquid at normal temperature, which is vaporized by heating to be blown to a sample surface.

Due to this, if the gas contacts a part that is lower in surface temperature than a vaporizing temperature or a temperature at which no precipitation occurs under gas atmospheric pressure, there is a possibility of solidification or liquidization. In this case, adsorption can be shortened or precipitation can be prevented by conducting part heating to a temperature not lower than the temperature of vaporization or the temperature at which no precipitation occurs under the gas atmospheric pressure.

DETAILED DESCRIPTION OF THE INVENTION

Figure 1:
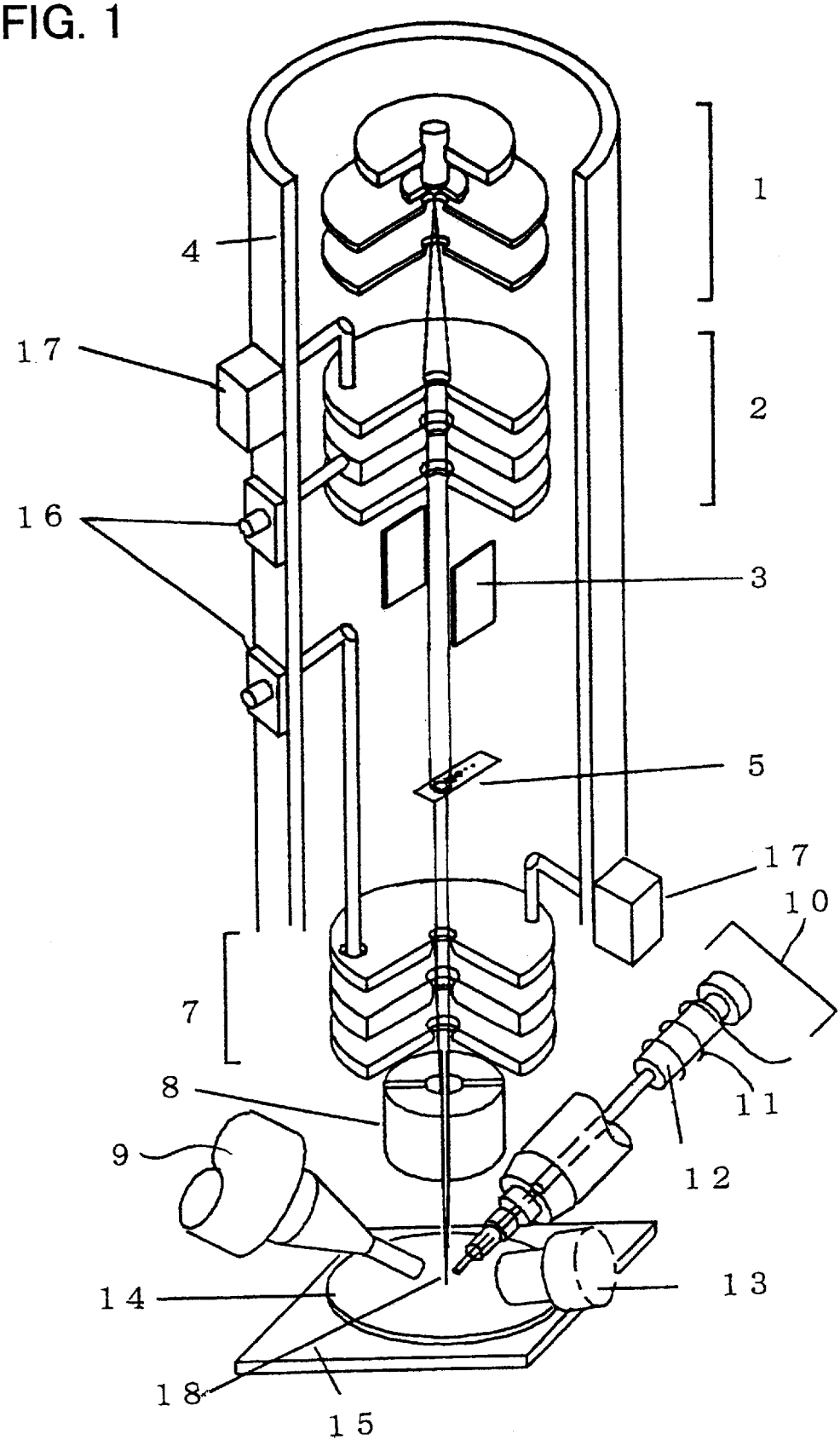
FIG. 1 is a sectional view of an embodiment of the present invention.

Hereinafter, an embodiment of the present invention is explained with reference to the accompanying drawing, FIG. 1 shows an embodiment of an ion beam processing apparatus according to the present invention. Ions generated by an ion source 1 are collected by an ion optical system 2, 7 and condensed into a focused ion beam 18. On an axis of the focused ion beam 18 a movable restriction 5 or aperture member is arranged which has apertures or holes of a plurality of different sizes. By selecting a hole diameter of the movable restriction 5 corresponding to the axis of the focused ion beam 18, it is possible to vary the current of the focused ion beam 18 irradiated on to a surface of a sample 14. Incidentally, the sample 14 is rested on a stage 15 movable in XYZ directions. In the vicinity of the irradiation position of the focused ion beam 18 onto the sample 14, a secondary charged particle detector 13 is provided which detects secondary charged quantum emanating from the sample 14 in response to irradiation of the sample by the focused ion beam 18.

Also, where the sample 14 is an insulator, there is provided a charge neutralizing electron gun 9 for irradiating an electron on beam to the sample 14 in order to prevent (neutralize) the sample 14 from charging (+) by irradiation of the focused ion beam 18. Also, on the axis of the focused ion beam 18, there is provided a scanning electrode 8 for raster-scanning the focused ion beam 18 and a beam blanker 3 for interrupting the focused ion beam 18 from being irradiated onto the sample 14 surface. By controlling the scanning electrode 8 and the beam blanker 3, the focused ion beam 18 can be irradiated onto only a predetermined region of the sample 14 surface.

A gas supply device 10 is provided to locally blow a gas onto a focused ion beam 18 irradiation position on the sample 14. The blown gas uses may include a gas that forms a film over a sample 14 surface by the focused ion beam 18 (e.g. metal carbonyl compound or pyrene) or a gas that etches the sample 14 surface (e.g. halogen gas, halogen compound gas). The gas is stored in a reservoir 12 provided in the gas supply device 10. The reservoir 12 is provided with a heater 11 to heat up the gas.

Further, a high pressure connector 16 for supplying high voltage to the ion optical systems 2, 7 is attached to a housing 4 for accommodating an ion source 1, etc. in a vacuum state. Furthermore, the housing 4 is provided with a heating device 17 to heat up the ion optical systems 2, 7. The heating device 17 may be one to heat the ion optical systems 2, 7 to a predetermined temperature, and is not required to be particularly specified.

Next, an example of use of the present apparatus is explained. A focused ion beam 18 is irradiated onto a sample 14 disposed on the stage 15, and secondary charged particles generated from the sample 14 are detected by the secondary charged particle detector 13. A signal from the secondary charged particle detector 13 is passed through a not-shown A/D converter, and the sample 14 surface is image-displayed by a not-shown display device. Based on an image of the sample surface image-displayed, a processing area of the sample 14 is determined and the sample 14 is processed by the focused ion beam 18. The material gas is blown by the gas supply device 10.

The material gas is packed in the reservoir 12. The reservoir 12 is measured in temperature by a temperature sensor, e.g. thermo-couple. The temperature is set and controlled to such a temperature that the vapor pressure of the material gas becomes predetermined pressure. The material gas within the reservoir 12 is blown, by opening a not-shown valve and through this valve, through a nozzle portion of the gas supply device 10 onto the sample 14. Simultaneous with the gas blow, the focused ion beam is repeatedly scanned across and irradiated onto the sample 14 surface. Ion beam processing is effected by the material gas (pattern film formation, or etch-removing a pattern form on the sample surface)

Also, although not shown in FIG. 1, the material gas is introduced not only from the reservoir but also from a gas supplying unit. This may be used where the vapor pressure of the material gas is high,even at a normal temperature (room temperature) and a desired pressure is not available by use of only the reservoir temperature control.

For the gas supplying unit, buffer pressure is measured by a vacuum gauge and the material gas is supplied by controlling a control valve such that the buffer pressure becomes constant by a pressure controller. In also this case, the material gas controlled by the pressure control is blown from the gas supply device 10 onto the sample 14.

In the above described apparatus, the ion optical systems 2, 7 are heated by the heating device 17. The heating device 17 is a unit such as a heater which can conduct heat from the housing 4 exterior and directly heat an ion optical system 2, 7 part within a vacuum. Structuring is made such that the ion optical systems 2, 7 are heated and their surfaces are prevented from being subject to gas absorption.

FIG. 1 illustrates an embodiment in which a part of the ion optical systems 2, 7 is heated by heat conduction from the outside. The heating of the ion optical systems 2, 7 is possible in a portion grounded to the ground besides a part of the electrode.

Also, in the high pressure connector 16 (field through) for introducing high voltage to a vacuum besides the ion optical systems 2, 7, there is a portion (high voltage portion) that a portion applied by high voltage is opposite to the ground (installed section). In this portion as well there is a possibility to cause discharge. Due to this, apparatus is structured such that heating is made in a method similar to the ion optical systems 2, 7 to prevent gas adsorption.

With this structure, gas adsorption became unlikely to occur and discharge became difficult to occur. For example, where the material gas includes hexacarbonyl tungsten, a reservoir is heated to about sixty plus or minus several degrees to conduct gassification. Accordingly, by heating a field-through and the surface of the ion optical system 2, 7 to approximately 60° C., solidification could be prevented from occurring on the ion optical system 2, 7 surface.

What is claimed is:

1. In a focused ion beam apparatus comprising an ion optical system for focusing an ion beam emitted from an ion source, a scanning electrode for irradiating the focused ion beam onto a sample surface and scanning the focused ion beam across a predetermined region of the sample surface, a secondary charged particle detector for detecting secondary charged particles generated in response to the ion beam irradiation and outputting a corresponding signal, a display for displaying an image of the sample surface based on the output signal of the secondary charged particle detector, and a gas injection gun for blowing a gas to the sample surface, the improvement wherein: the focused ion beam apparatus further comprises a heating device for heating the ion optical system.

2. A focused ion beam apparatus according to claim 1; wherein the heating device comprises a heater for directly heating the ion optical system.

3. A focused ion beam apparatus according to claim 1; wherein the gas cooperates with the focused ion beam irradiated on the sample surface to deposit a film on the predetermined region of the sample surface irradiated by the focused ion beam.

4. A focused ion beam apparatus according to claim 1; wherein the gas cooperates with the focused ion beam irradiated on the sample surface to etch the predetermined region of the sample surface irradiated by the focused ion beam.

5. A focused ion beam apparatus according to claim 1; further comprising a housing for accommodating the ion source and the ion optical system, and wherein the heating device comprises a heater which heats the ion optical system by thermal conduction through the housing.

6. A focused ion beam apparatus according to claim 1; further comprising a housing for accommodating the ion source and the ion optical system, and a high voltage connector for supplying a high voltage to the ion optical system, and wherein the heating device heats the high voltage connector from outside of the housing.

7. A focused ion beam apparatus according to claim 3; wherein the gas comprises tungsten carbonyl.

8. A focused ion beam apparatus according to claim 4; wherein the gas comprises a halogen gas or a compound halide gas.

9. A focused ion beam apparatus according to claim 1; wherein the heating device heats the ion optical system to a sufficient temperature to substantially prevent solidification of particles thereon.

10. A focused ion beam apparatus according to claim 1; further comprising an aperture member disposed in a path of the focused ion beam, the aperture member having a plurality of holes of different sizes therethrough and being mounted to allow any one of the plural holes to be placed in the path of the focused ion beam.

11. A focused ion beam apparatus according to claim 1; further comprising a blanking electrode for turning the focused ion beam on or off.

12. A focused ion beam apparatus according to claim 1; wherein the ion optical system comprises at least one focusing lens for focusing the ion beam emitted by the ion source.

13. A charged particle beam apparatus comprising: a charged particle source for emitting a charged particle beam; an optical system for focusing the charged particle beam; a scanning electrode for irradiating a sample surface with the charged particle beam and scanning the charged particle beam across a desired region of the sample surface; and a heating device for heating selected portions of the optical system.

14. A charged particle beam apparatus according to claim 13; further comprising a secondary charged particle detector for detecting secondary charged particles generated in response to irradiation of the sample surface with the charged particle beam and outputting a corresponding signal; and a display unit for displaying an image of the sample surface based on the output signal of the secondary charged particle detector.

15. A charged particle beam apparatus according to claim 13; further comprising a gas injection gun for injecting a gas toward the sample surface.

16. A charged particle beam apparatus according to claim 15; wherein the gas cooperates with the charged particle beam irradiated on the sample surface to etch the desired region of the sample surface irradiated by the charged particle beam.

17. A charged particle beam apparatus according to claim 16; wherein the gas comprises a halogen gas or a compound halide gas.

18. A charged particle beam apparatus according to claim 15; wherein the gas cooperates with the charged particle beam irradiated on the sample surface to deposit a film on the desired region of the sample surface irradiated by the charged particle beam.

19. A charged particle beam apparatus according to claim 18; wherein the gas comprises tungsten carbonyl.

20. A charged particle beam apparatus according to claim 13; further comprising a housing for accommodating the charged particle beam and the optical system; and wherein the heating device comprises a heater which heats selected portions of the optical system by thermal conduction through the housing.

21. A charged particle beam apparatus according to claim 13; further comprising an aperture member disposed in a path of the charged particle beam, the aperture member having a plurality of holes of different sizes therethrough and being mounted to allow any one of the plural holes to be placed in the path of the charged particle beam.

22. A charged particle beam apparatus according to claim 13; further comprising a blanking electrode for turning the charged particle beam on or off.

23. A charged particle beam apparatus according to claim 13; wherein the optical system has at least one focusing lens for focusing the charged particle beam emitted by the charged particle source.

24. A charged particle beam apparatus according to claim 13; further comprising a housing for accommodating the charged particle source and the ion optical system; and a high voltage connector for supplying a high voltage to the optical system; and wherein the heating device heats the high voltage connector from outside of the housing.

25. A charged particle beam apparatus according to claim 13; wherein the charged particle beam comprises an ion beam.

26. A charged particle beam apparatus according to claim 13; wherein the heating device heats the optical system to a sufficient temperature to substantially prevent solidification of particles thereon.

27. A charged particle beam apparatus comprising: a housing; a charged particle source contained in the housing for emitting charged particles; an optical system contained in the housing for focusing the charged particles to produce a charged particle beam; a scanning electrode contained in the housing for scanning the charged particle beam across a desired region of a sample surface; and a heating device for heating an internal component of the charged particle beam apparatus contained in the housing to prevent a gas contained in the housing from solidifying onto a surface of the internal component.

28. A charged particle beam apparatus according to claim 27; wherein the heated internal component comprises the optical system.

29. A charged particle beam apparatus according to claim 28; wherein the optical system has at least one focusing lens for focusing the charged particles emitted by the charged particle source.

30. A charged particle beam apparatus according to claim 27; further comprising a secondary charged particle detector for detecting secondary charged particles generated in response to the irradiation of the charged particle beam and outputting a corresponding signal; and a display for displaying an image of the sample surface based on the output signal of the secondary charged particle detector.

31. A charged particle beam apparatus according to claim 27; further comprising a gas injection gun for blowing a gas toward the sample surface.

32. A charged particle beam apparatus according to claim 31; wherein the gas cooperates with the charged particle beam irradiated on the sample surface to etch the desired region of the sample surface irradiated by the charged particle beam.

33. A charged particle beam apparatus according to claim 32; wherein the gas comprises a halogen gas or a compound halide gas.

34. A charged particle beam apparatus according to claim 31; wherein the gas cooperates with the charged particle beam irradiated on the sample surface to deposit a film on the desired region of the sample surface irradiated by the charged particle beam.

35. A charged particle beam apparatus according to claim 34; wherein the gas comprises tungsten carbonyl.

36. A charged particle beam apparatus according to claim 27; wherein the heating device comprises a heater which heats the optical system by thermal conduction through the housing.

37. A charged particle beam apparatus according to claim 27; further comprising a high voltage connector for supplying a high voltage to the optical system; and wherein the heating device heats the high voltage connector from outside of the housing.

* * * * *